United States Patent
Komatsu et al.

(10) Patent No.: US 6,319,817 B1
(45) Date of Patent: *Nov. 20, 2001

(54) METHOD OF FORMING VIAHOLE

(75) Inventors: Hiroshi Komatsu; Makoto Hashimoto; Motoaki Nakamura, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/318,254

(22) Filed: May 25, 1999

Related U.S. Application Data

(62) Division of application No. 08/733,192, filed on Oct. 17, 1996, now Pat. No. 5,981,376.

(30) Foreign Application Priority Data

Oct. 23, 1995 (JP) .................................................. 7-273835

(51) Int. Cl.⁷ ............................................... H01L 21/4763
(52) U.S. Cl. .......................... 438/629; 438/637; 438/639
(58) Field of Search ........................... 438/629, 637–640, 438/668, 672, 675, 6.4

(56) References Cited

U.S. PATENT DOCUMENTS

| | | | |
|---|---|---|---|
| Re. 36,475 | * 12/1999 | Choi | 438/628 |
| 4,430,791 | * 2/1984 | Dockerty | 438/568 |
| 5,066,612 | * 11/1991 | Ohba et al. | 438/624 |
| 5,117,273 | * 5/1992 | Stark et al. | 438/639 |
| 5,319,246 | * 6/1994 | Nagamine et al. | 257/758 |
| 5,393,682 | * 2/1995 | Liu | 438/705 |
| 5,472,900 | * 12/1995 | Vu et al. | 438/639 |
| 5,783,495 | * 7/1998 | Li et al. | 438/738 |
| 5,834,367 | * 11/1998 | Otsuka et al. | 438/618 |
| 5,981,376 | * 11/1999 | Komatsu et al. | 438/629 |
| 6,033,990 | * 3/2000 | Kishimoto et al. | 438/710 |
| 6,077,773 | * 6/2000 | Lin | 438/637 |

FOREIGN PATENT DOCUMENTS

1071125 * 1/2001 (EP) ............................ H01L/21/336

* cited by examiner

Primary Examiner—Charles Bowers
Assistant Examiner—Thanh Nguyen
(74) Attorney, Agent, or Firm—Ronald P. Kananen; Rader, Fishman & Grauer

(57) ABSTRACT

A method of forming a viahole in an interlayer insulating film without formation of irregularities on a side wall of the viahole. The method includes a first step of forming a viahole in an interlayer insulating film having a multi-layer structure of plural kinds of insulating layers; a second step of forming a side wall film on a side wall of the viahole; and a third step of removing a native oxide film formed on a bottom portion of the viahole by etching.

11 Claims, 5 Drawing Sheets

FIG. IA
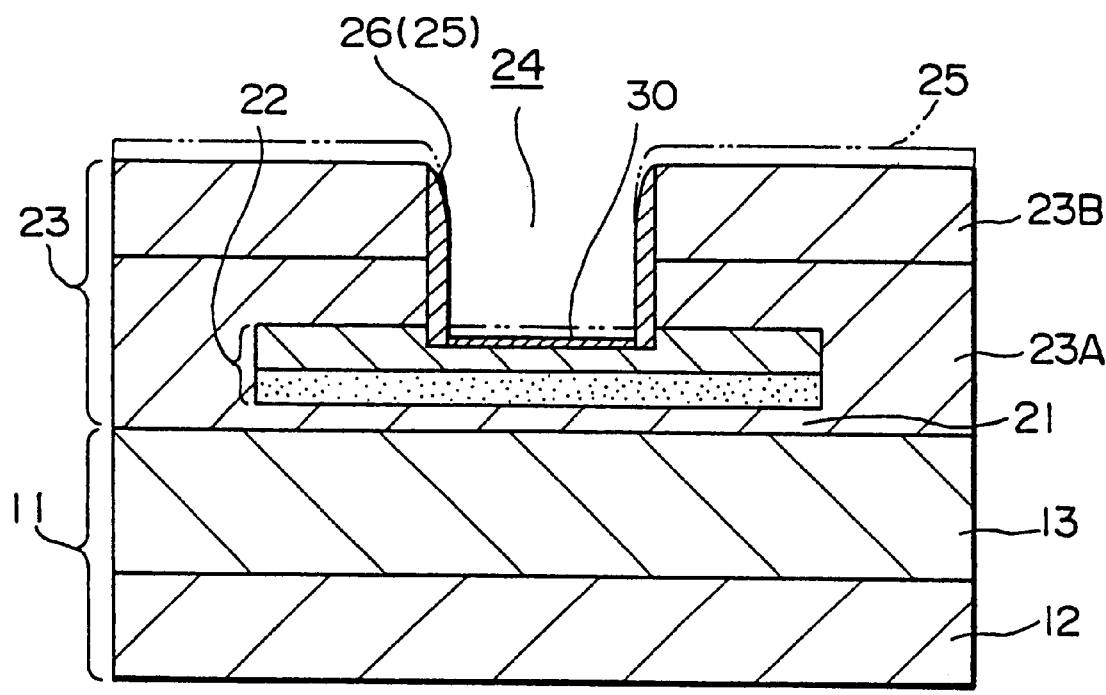
FIG. IB
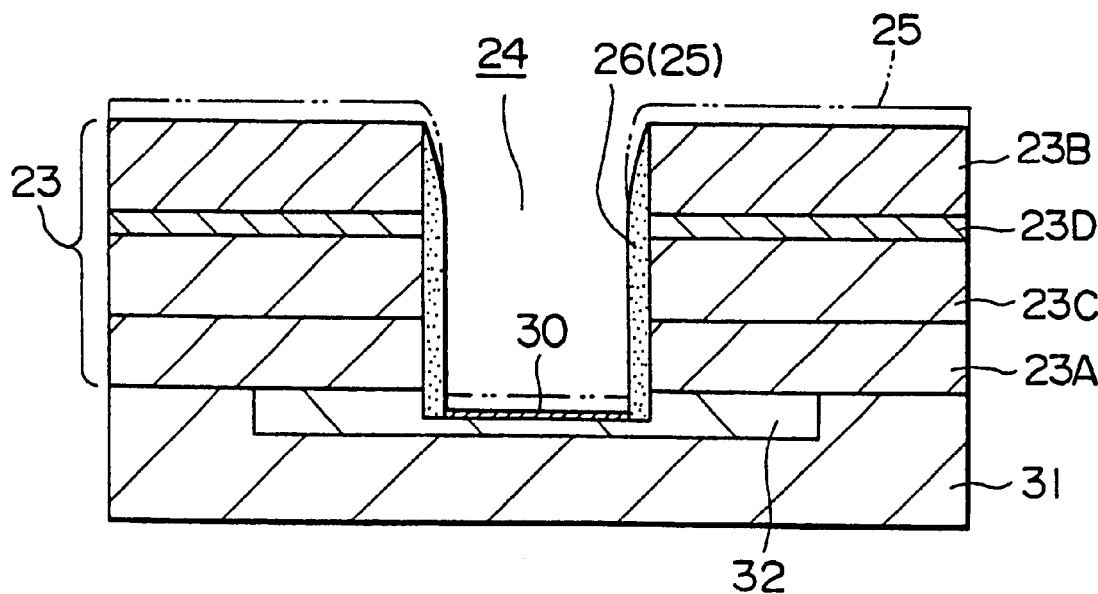

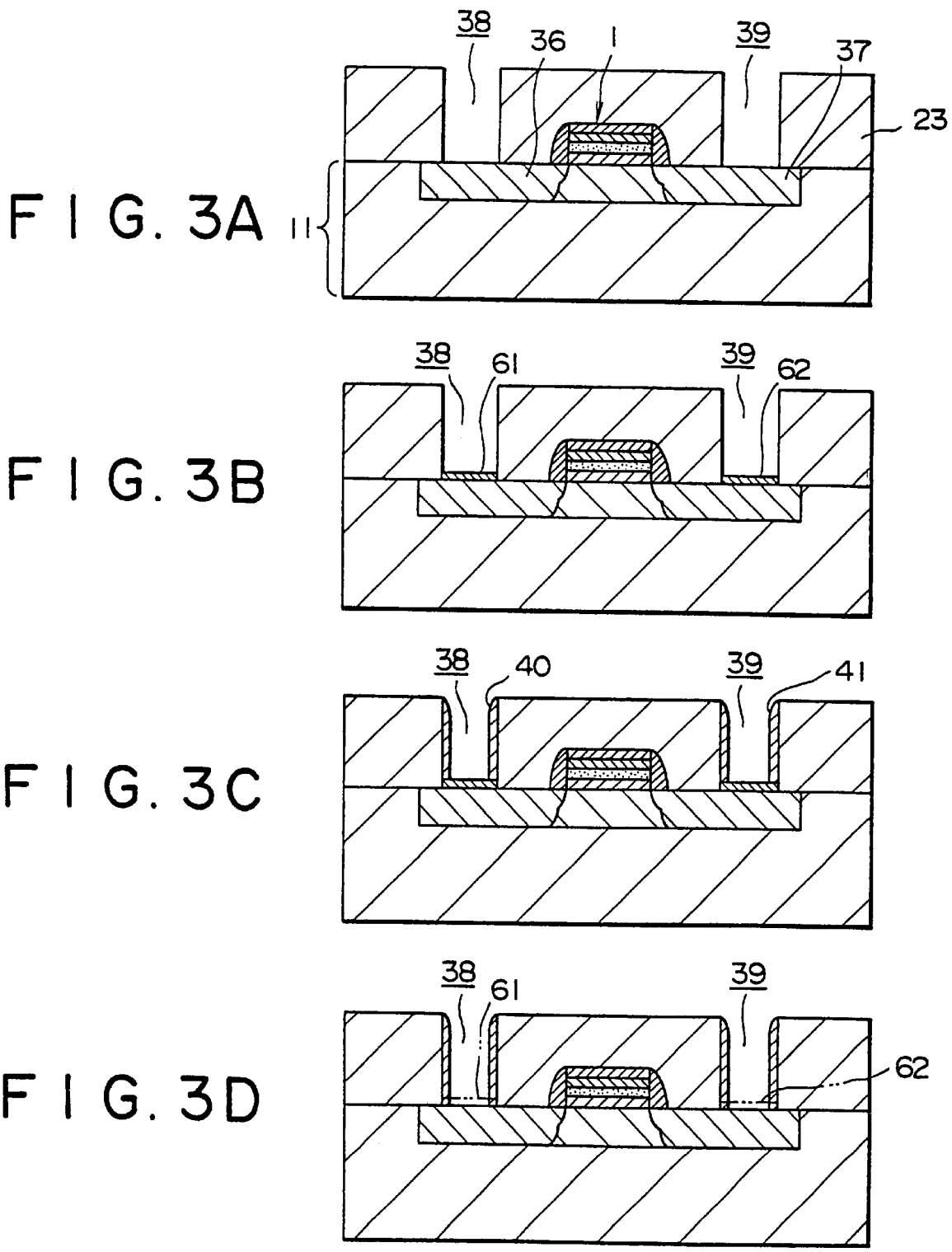

METHOD OF FORMING VIAHOLE

This application is a divisional of application Ser. No. 08/733,192 filed Oct. 17, 1996, now U.S. Pat. No. 5,981,376.

BACKGROUND OF THE INVENTION

The present invention relates to a method of forming a viahole in steps of fabricating semiconductor devices.

The processing technique in steps of fabricating LSI chips has become increasingly strict with the tendency toward finer-geometries and high integration of semiconductor devices.

In recent years, pattern printing by lithography and pattern processing by dry etching have been required to be improved particularly in terms of dimensional accuracy and dimensional margin in a region near processing limit along with the increased integration.

The number of stepped portions formed in a device is increased linearly with the number of interconnection layers. This tends to lower the focal depth in the exposure step in lithography, and to form stringers on the stepped portions at the time of dry etching.

To solve the above problems caused by the increased stepped portions, a process of planarizing an interlayer insulating film and/or an interconnection layer has been developed. In particular, an attempt has been made to improve the focal depth in lithography by achieving a high surface flatness through global planarization.

If an interlayer insulating film is perfectly planarized, it becomes possible to make smaller the amount of over-etching in dry etching upon formation of interconnections, and to enhance reliability of interconnections associated with step coverage of a metal film.

One of these techniques is to planarize an interlayer insulating film by chemical-mechanical polishing.

The technique for planarizing an interlayer insulating film by chemical-mechanical polishing will be described below.

An interlayer insulating film has a multi-layer structure in which a layer having a high polishing rate (for example, BPSG (Borophosphosilicate Glass) layer) is held by layers having a low polishing rate (for example, NSG (Non-doped Silicate Glass) layers). The surface of the interlayer insulating film is planarized using the layer having a low polishing rate as a polishing stopper, to eliminated stepped portions formed by a gate electrode, an interconnection and the like. The technique makes smooth the distribution of polishing rate within a wafer using a difference in polishing rate between two kinds of silicon oxide ($SiO_2$) layers, or enlarges a margin in terminal detection of polishing, so that the non-uniformity in polishing which is increased linearly with a wafer diameter can be avoided. Accordingly, such a technique becomes further important in the future.

However, in the case of planarizing an interlayer insulating film having a multi-layer structure of layers different in polishing rate by chemical-mechanical polishing and forming a contact hole or viahole (hereinafter, referred to "viahole") in the interlayer insulating film, there occur the following disadvantages:

(a) When a viahole formed in a planarized interlayer insulating film is subjected to light etching before being buried with a metal, the layers (different in polishing rate) of the interlayer insulating film in the viahole, particularly, on a side wall of the viahole are unevenly etched, and consequently, irregularities are formed on the side wall of the viahole.

(b) When the viahole having such a shape is buried with a metal by sputtering, the interlayer insulating film tends to be stepwise cut at portions unevenly etched, leading to a failure in burying of the viahole.

On the other hand, when the viahole is buried with a tungsten plug, an adhesive layer is discontinuously formed on a side wall of the viahole, resulting in separation at the discontinuous portions.

Incidentally, before a viahole is buried with a metal, a native oxide film formed on a bottom portion of the viahole is removed by light etching. This is essential for achieving a stable and low resistance connection between the metal buried in the viahole and the underlying layer. The light etching is performed by dipping in a buffer hydrofluoric acid (solution having a composition of HF: 0.1 wt %, $NH_4F$: 39.9 wt %, and $H_2O$: 60.0 wt %) for 60 seconds. The amount to be etched is about 3.0 nm for a thermal oxide film.

When an interlayer insulating film having a multi-layer structure of layers different in polishing rate is subjected to light etching, the etching rate becomes high at interfaces between the different insulating layers of the interlayer insulating film, as shown in FIGS. 4A and 4B.

FIG. 4A shows a state in which an interlayer insulating film 112 is formed in such a manner as to cover a gate electrode 111 and is formed with a viahole 113. The interlayer insulating film 112 is composed of a NSG (Non-doped Silicate Glass) layer 114 having a thickness of 200 nm (containing an offset oxide film (thickness: 120 nm) formed on the gate electrode 111), and a PSG (Phosphosilicate Glass) layer 115 having a thickness of 200 nm formed on the upper surface of the NSG layer 114.

After that, a native oxide film 116 (shown by the two-dot chain line) formed on a bottom portion of the viahole 113 is removed by light etching using a buffer hydrofluoric acid for 60 seconds. At this time, the etching rate becomes very high in the vicinity of an interface between the insulating layers of the interlayer insulating film 112, so that a recessed portion 117 is formed at the interface portion on a side wall of the viahole 113.

FIG. 4B shows a state in which an interlayer insulating film 123 is formed in such a manner as to cover a diffusion layer 122 formed in a semiconductor substrate 121 and is formed with a viahole 124. The interlayer insulating film 123 is composed of a NSG layer 125 having a thickness of 200 nm, a BPSG (Borophosphosilicate Glass) layer 126 having a thickness of 210 nm, an NSG layer 127 having a thickness of 50 nm, and a PSG layer 128 having a thickness of 200 nm. Also in this case, similarly, when a native oxide film 129 (shown by the two-dot chain line) formed on a bottom portion of the viahole 124 is removed by light etching, the etching rate becomes very high in the vicinity of an interface between the insulating layers of the interlayer insulating film 123. Consequently, recessed portions 129 and 129 are formed at the interface portions on the side wall of the viahole 124. Furthermore, the NSG layer 127 lower than the BPSG layer 126 and the PSG layer in a polishing rate 128 remains in an overhang shape in the viahole 124.

A process for improving such a shape of a side wall of a viahole is required for fabrication of the future devices having finer-geometries.

SUMMARY OF THE INVENTION

An object of the present invention is to provide a method of forming a viahole in an interlayer insulating film without formation of irregularities on a side wall of the viahole.

To achieve the above object, the present invention provides the following first and second methods of forming a viahole.

The first method includes: a first step of forming a viahole in an interlayer insulating film having a multi-layer structure of plural kinds of insulating layers; a second step of forming a side wall film on a side wall of the viahole; and a third step of removing a native oxide film formed on a bottom portion of the viahole by etching.

The second method includes: a first step of forming a viahole in an interlayer film having a multi-layer structure of plural kinds of insulating layers; a second step of forming an oxide film by oxidizing a underlying layer at least at a bottom portion of the viahole; a third step of forming a side wall film on a side wall of the viahole; a fourth step of removing the oxide film; and a fifth step of removing a native oxide film formed on the bottom portion of the viahole by etching; wherein the side wall film is made from a material having an etching selection ratio (etching rate of the oxide film formed in the second step/etching rate of the side wall film) more than 1.

According to the above-described first and second methods of the present invention, a side wall film is formed on a side wall of a viahole formed in an interlayer insulating film having a multi-layer structure of plural kinds of insulating layers, that is, the side wall of the viahole is covered with one continuous film. Accordingly, interfaces between the different insulating layers of the interlayer insulating film are not exposed into the viahole by the effect of the side wall film, so that they are not etched upon removal of a native oxide film formed on a bottom portion of the viahole. As a result, the side wall of the viahole is prevented from being formed with irregularities.

BRIEF DESCRIPTION OF THE DRAWINGS

FIGS. 1A and 1B are views illustrating examples according to a first method of the present invention;

FIGS. 3A to 3D are views showing steps of fabricating a multi-layer interconnection structure according to a second method of the present invention.

DETAILED DESCRIPTION OF THE PREFERRED EMBODIMENTS

Figure 2A:
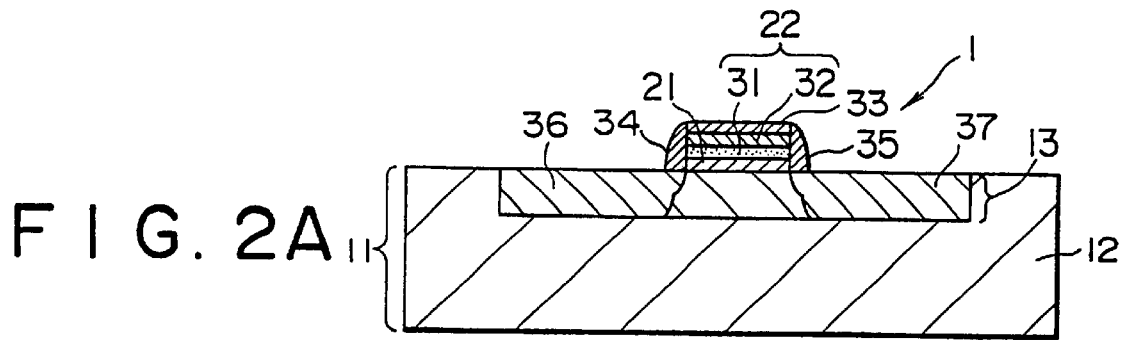
FIGS. 2A to 2F are views showing steps of fabricating a multi-layer interconnection structure according to the first method of the present invention.

The first method of the present invention will be described with reference to examples shown in FIGS. 1A to 1B. FIG. 1A shows a viahole formed in an interlayer insulating film on a gate electrode, and FIG. 1B shows a viahole formed in an interlayer insulating film on a diffusion layer formed in a semiconductor substrate.

As shown in FIG. 1A, a SOI (Silicon On Insulator) substrate 11 is composed of an insulating layer 12 and a silicon layer 13 formed on the insulating film 12. A gate electrode 22 having a so-called polycide structure (which is a two-layer structure having a polycrystalline silicon film and a metal silicide film formed thereon) was formed on the silicon layer 13 with a gate insulating film 21 sandwiched therebetween. An interlayer insulating film 23 having a two-layer structure was formed in such a state as to cover the gate electrode 22. The interlayer insulating film 23 is composed of a NSG layer 23A and a PSG layer 23B.

Next, a first step of the first method of the present invention was carried out. The interlayer insulating film 23 on the gate electrode 22 was formed with a viahole 24 by a known method. Specifically, the interlayer insulating film 23 was perforated at a specified position by etching using a resist mask (not shown) formed by lithography.

In a second step, a TEOS (Tetraethoxysilane) silicon oxide film 25 was formed on the interlayer insulating film 23 by CVD (Chemical Vapor Deposition) using TEOS as a source gas. A portion, shown by the two-dot chain line, of the TEOS silicon oxide film 25 was then removed by etch-back, to form a side wall film 26 composed of the TEOS silicon oxide film 25 on a side wall of the viahole 24. The side wall film 26 is preferably made from a material having an etching rate lower than that of a native oxide film 30 in etching using a hydrofluoric acid based etchant, for example, the above-described TEOS silicon oxide film 25.

In a third step, the native oxide film 30 formed on a bottom portion of the viahole 24 was removed by wet etching using a buffer hydrofluoric acid.

On the other hand, in the example shown in FIG. 1B, a diffusion layer 32 was formed in a semiconductor substrate 31. An interlayer insulating film 33 having a four-layer structure was formed in such a state as to cover the diffusion layer 32. The interlayer insulating film 23 is composed of a NSG layer 23A, a BPSG layer 23C, a NSG layer 23D, and a PSG layer 23B.

Next, a first step of the first method of the present invention was carried out. The interlayer insulating film 23 on the diffusion layer 32 was formed with a viahole 24 by a known method. Specifically, the interlayer insulating film 23 was perforated at a specified position by etching using a resist mask (not shown) formed, by lithography.

In a second step, a TEOS silicon oxide film 25 was formed on the interlayer insulating film 23 by CVD using TEOS as a source gas. A portion, shown by the two-dot chain line, of the TEOS silicon oxide film 25 was then removed by etch-back, to form a side wall film 26 composed of the TEOS silicon oxide film 25 on a side wall of the viahole 24.

In a third step, a native oxide film 30 formed on a bottom portion of the viahole 24 was removed by wet etching using a buffer hydrofluoric acid.

In each of the first and second methods of forming a viahole described with reference to FIGS. 1A and 1B, the side wall film 26 is formed on the side wall of the viahole 24, that is, the side wall of the viahole 24 is covered by one continuous film. Accordingly, interfaces between the different insulating layers of the interlayer insulating film 23 are not exposed inside the viahole 24 by covering of the side wall film 26, so that they are not etched upon removal of the native oxide film 30 formed on the bottom portion of the viahole 24. As a result, the side wall of the viahole 24 is prevented from being formed with irregularities.

Next, an example in which a multi-layer interconnection structure is formed using the first method of the present invention will be described with reference to fabrication steps shown in FIGS. 2A to 2F. In this example, a gate step formed on a SOI substrate is covered by global planarization with an interlayer insulating film; a viahole is formed in the interlayer insulating film; and an interconnection layer is formed on the interlayer insulating film. In addition, parts corresponding to those shown in FIGS. 1A and 1B are indicated by the same characters.

As shown in FIG. 2A, a SOI substrate 11 is composed of an insulating layer 12 made of silicon oxide and a silicon layer 13 formed on the insulating film 12. In addition, the surface of the insulating film 12 is substantially at the same level as that of the silicon layer 13.

Next, a gate electrode 22 was formed on the SOI substrate 11 with a gate insulating film 21 sandwiched therebetween by a known method. The gate insulating film 21 was made from silicon oxide to a thickness of 9 nm. The gate electrode 22 was formed of a polycrystalline silicon film 31 having a thickness of 70 nm and a tungsten silicide ($WSi_x$) film 32 having a thickness of 70 nm, and a so-called offset insulating film 33 was formed on the $WSi_x$ film 32 in self-alignment contact. The offset insulating film 33 was formed from silicon oxide to a thickness of 120 nm. Then, a LDD diffusion layer (not shown) was formed on the silicon layer 13 on both sides of the gate electrode 22 by ion implantation. Next, side wall insulating films 34 and 35 as LDD spacers were formed on side walls of the gate electrode 22.

After that, source/drain regions 36 and 37 were formed in the silicon layer 13 by ion implantation using the gate electrode 22 and the side wall insulating films 34 and 35 as an ion implantation mask. A MOS transistor 1 was thus formed on the SOI substrate 11.

Figure 2B:
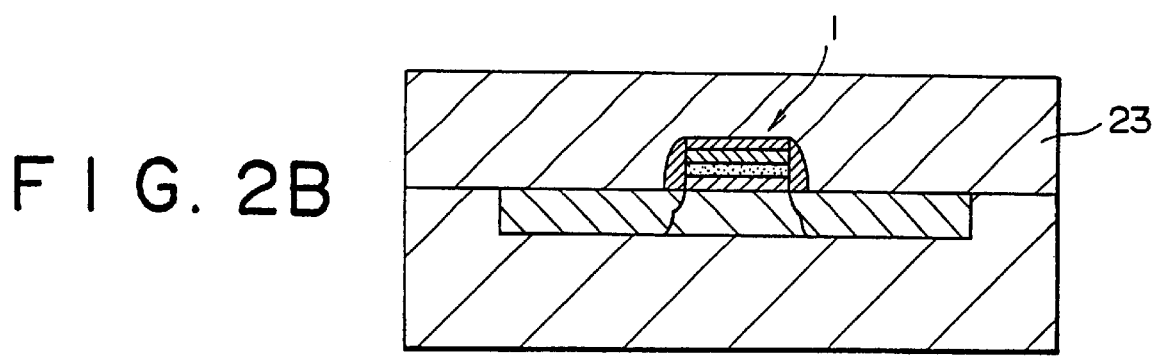

In a first step, an interlayer insulating film having two kinds of layers functioning as polishing stoppers was formed, and the surface of the interlayer insulating film was planarized, to eliminate the gate step (see FIG. 2B).

More specifically, an interlayer insulating film 23 was formed in such a state as to cover the MOS transistor 1 by CVD. The interlayer insulating film 23 is composed of a NSG layer having a thickness of 200 nm, a BPSG layer having a thickness of 210 nm, and a NSG layer having a thickness of 50 nm and formed in this order.

After that, the surface of the interlayer insulating film 23 was planarized by chemical-mechanical polishing. In this polishing, the lower NSG layer functions as a polishing stopper at an upper portion of the gate step, and the upper NSG layer functions as a polishing stopper at a lower portion of the gate step.

The polishing condition was as follows: namely, a non-woven fabric type polishing cloth (secondarily treated with region) was used as a polishing pad and a polishing solution containing a powder silica based slurry (average particle size: 5–10 mm) was supplied to the polishing cloth at a flow rate of 30 $cm^3$/min; and the polishing pressure was set at 160 g/$cm^2$ and the rotation of a platen was set at 38 rpm.

Figure 2C:
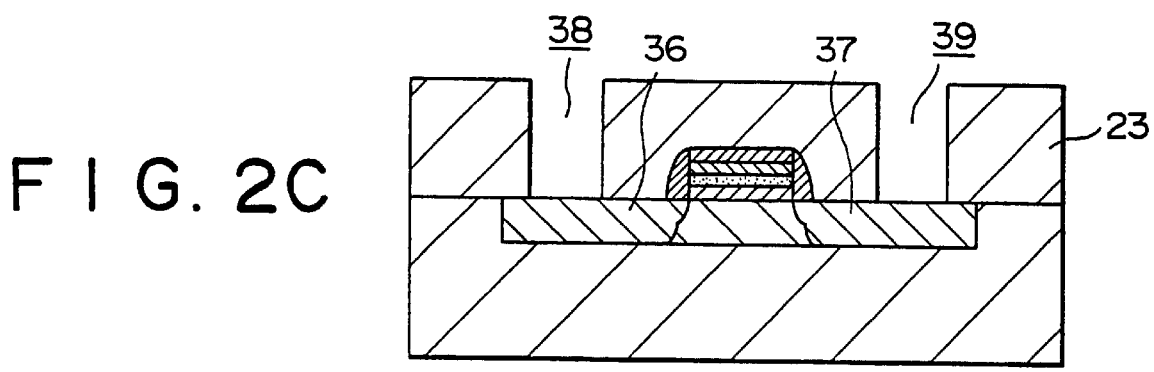

As shown in FIG. 2C, the interlayer insulating film 23 was formed with viaholes 38 and 39 (similar to the viahole 24 shown in FIG. 1) respectively connected to the source/drain regions 36 and 37 by lithography (resist coating, exposure, development, baking, and the like) and etching (for example, reactive ion etching (RIE)).

The RIE was performed by a magnetron etching apparatus using an etching gas composed of trifluoromethane ($CHF_3$) at a flow rate of 40 sccm ("sccm" expresses a flow rate in volume ($cm^3$/min) at a standard condition) and carbon monoxide (CO) at a flow rate of 260 sccm. The temperature of a susceptor was set at −30° C., the pressure of an etching atmosphere was set at 5.3 Pa, and the applied power was set at 1.45 kw.

The etching mask (not shown) used for the above etching was then removed by ashing or the like.

Figure 2D:
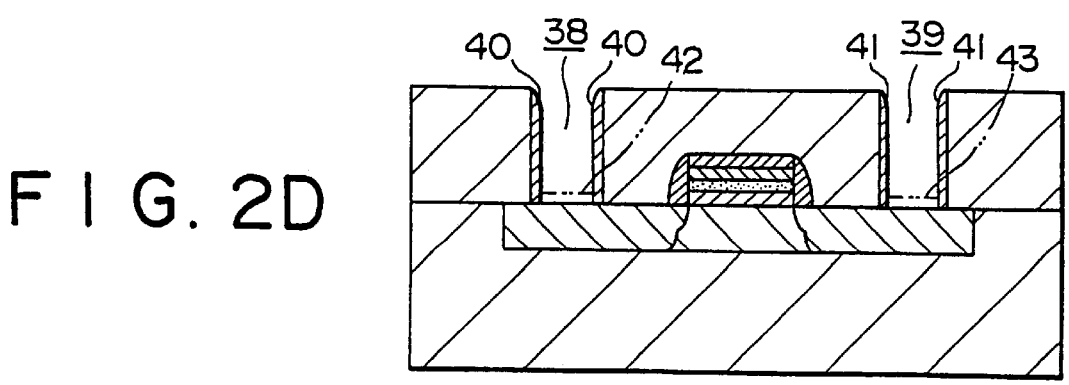

In a second step, a silicon oxide film was formed over the entire surface, followed by etch-back, and consequently the silicon oxide film remains only on side walls of the viaholes 38 and 39, to form side wall films 40 and 41 (see FIG. 2D).

The silicon oxide film (for formation the side wall films 40 and 41) was formed by a vertical type low pressure CVD system using a source gas composed of TEOS with a flow rate of 300 sccm. The pressure of a film formation atmosphere was set at 93 Pa and the film formation temperature was set at 700° C.

The etch-back for the silicon oxide film was performed by a magnetron etching system using an etch-back gas composed of trifluoromethane ($CHF_3$) with a flow rate of 50 sccm. The susceptor temperature was set at −30° C., the pressure of the etch-back atmosphere was set at 2.7 Pa, and the applied power was set at 500 W.

In a third step, native oxide films 42 and 43 (shown by the two-dot chain line, which are similar the native oxide film 30 shown in FIG. 1) respectively formed on the bottom portions of the viaholes 38 and 39 were removed by light etching. The light etching was performed by dipping in a buffer hydrofluoric acid (solution having a composition of HF: 0.1 wt %, $NH_4F$: 39.9 wt %, and $H_2O$: 60.0 wt %) for 60 seconds.

Figure 2E:
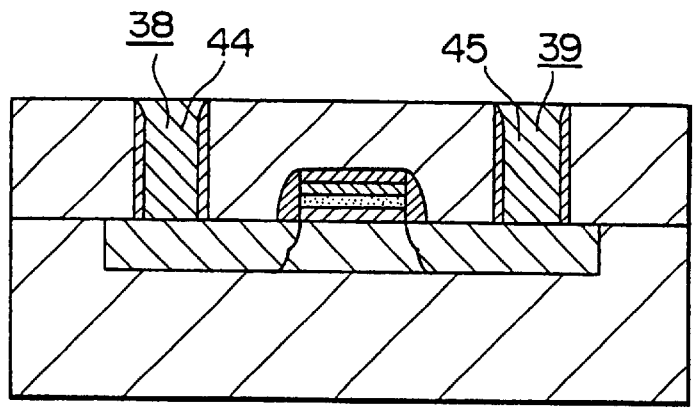

After that, as shown in FIG. 2E, the viaholes 38 and 39 were buried with a conductive material (for example, a metal) by a known plug formation method, to form plugs 44 and 45.

Figure 2F:
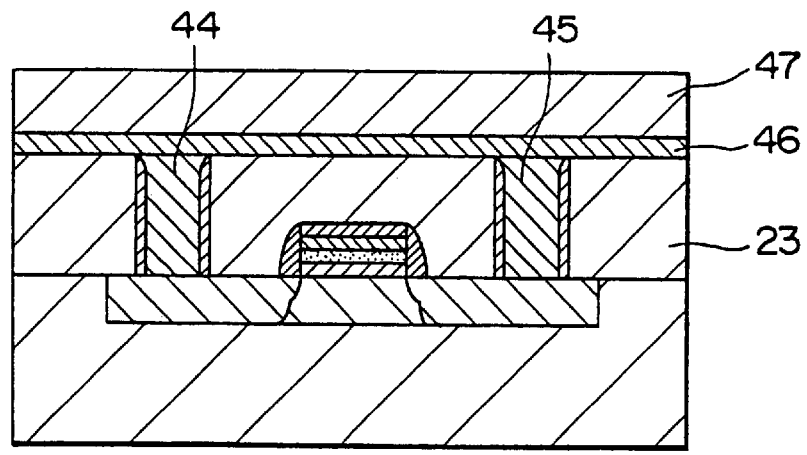
Figure 4A:
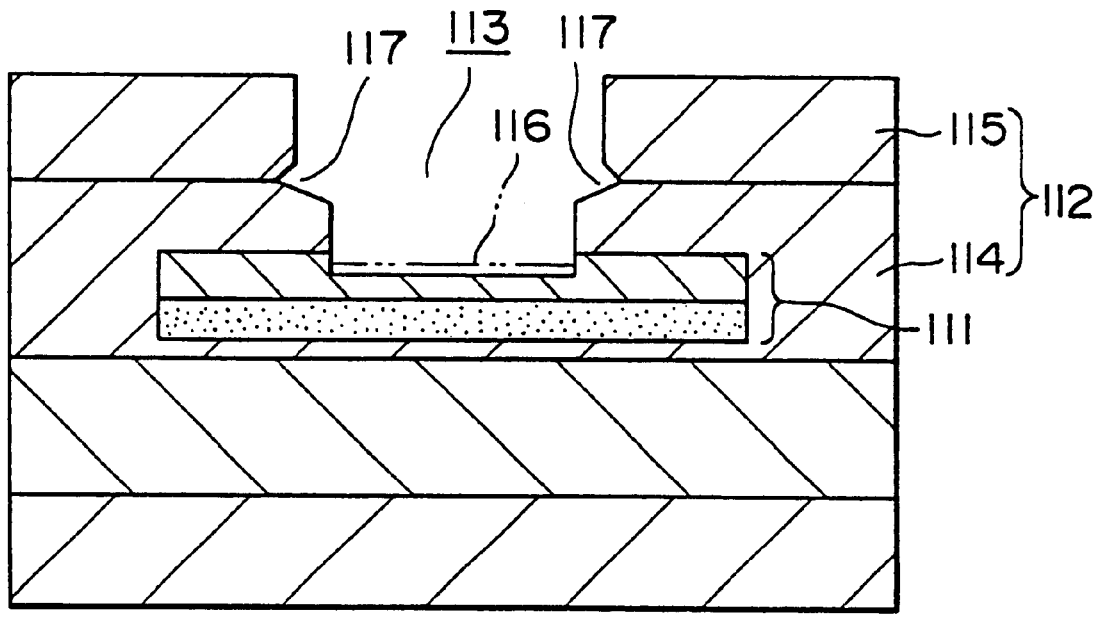
FIGS. 4A and 4B are views illustrating problems of a related art.
Figure 4B:
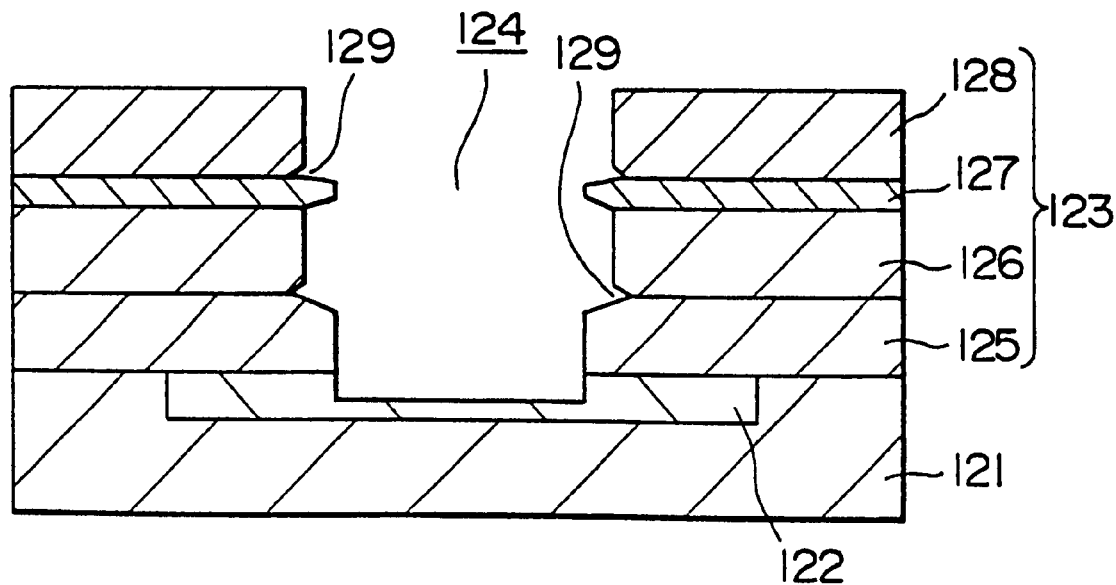

Next, as shown in FIG. 2F, an adhesive layer 46 was formed on the plugs 44 and 45 and on the interlayer insulating film 23, and an interconnection layer 47 was formed on the adhesive layer 46. After that, the adhesive layer 46 and the interconnection layer 47 were subjected to patterning by lithography and etching, to form upper interconnections (not shown).

According to the method described with reference to FIGS. 2A to 2F, the side wall films 40 and 41 are respectively formed in self-alignment on the side walls of the viaholes 38 and 39, and accordingly, the interlayer insulating film 23 having the different insulating layers is not exposed inside the viaholes 38 and 39. As a result, the side walls of the viaholes 38 and 39 are prevented from being formed with irregularities upon light etching.

The viaholes 38 and 39 can be thus buried with a conductive material (for formation the plugs 44 and 45) without formation of any cavity.

Incidentally, the diameters of the viaholes 38 and 39 are respectively reduced by provision of the side wall films 40 and 41. If the side wall films 40 and 41 are formed from a material having a relatively large resistance against light etching using a buffer hydrofluoric acid, the width of each of the side wall films 40 and 41 can be reduced at minimum. Consequently, the reduction in diameter in each of the viaholes 38 and 39 can be minimized. Such a side wall film having a resistance against light etching may include, other than the above-described TEOS oxide film formed by a low pressure CVD system, a silicon oxide film formed by CVD at a high temperature (for example, about 700° C.) using a source gas composed of dinitrogen oxide ($N_2O$) and monosilane ($SiH_4$), a silicon oxide film formed by CVD at a high temperature (for example, about 700° C.) using a source gas composed of dinitrogen oxide ($N_2O$) and dichlorosilane ($SiH_2Cl_2$), and a silicon nitride ($Si_3N_4$) film formed by a low pressure CVD system.

Next, an example to which the second method of the present invention is applied will be described with reference to fabrication steps shown in FIGS. 3A to 3D.

In the second method, there is used a side wall film different from that made from silicon oxide used in the first method.

As shown in FIG. 3A, a MOS transistor 1 was formed on a SOI substrate 11 in the same manner as that described with reference to FIG. 2A. The configuration of the MOS transistor 1 is the same as that shown in FIG. 2A. After that, a first step of the second method of the present invention was carried out. An interlayer insulating film 23 was formed in such a state as to cover the MOS transistor 1 in the same manner as that described with reference to FIG. 2B. The surface of the interlayer insulating film 23 was then planarized by chemical-mechanical polishing.

Next, the interlayer insulating film 23 was formed with viaholes 38 and 39 respectively connected to source/drain regions 36 and 37 by lithography and etching (for example, RIE).

The RIE was performed in the same condition as that described in the first method.

Subsequently, a second step was carried out as shown in FIG. 3B. In this step, thin oxide films 61 and 62 were respectively formed on bottom portions and inner walls of the viaholes 38 and 39 to a thickness of about 5 nm or less by thermal oxidation. Each of the oxide films 61 and 62 was formed from silicon oxide by oxidation in a dry oxygen ($O_2$) atmosphere at a normal pressure and at 850° C. using a vertical oxidizing furnace.

As shown in FIG. 3C, in a third step, a polycrystalline silicon film (for formation a side wall film) was formed on side walls of the viaholes 38 and 39. The polycrystalline silicon film was etched-back, and it remains only on the side walls of the viaholes 38 and 39, to form side wall films 40 and 41.

The polycrystalline silicon film used for the side wall films 40 and 41 was formed by CVD using a vertical type low pressure CVD system. In this CVD, monosilane ($SiH_4$) at a flow rate of 400 sccm was used as a source gas, the pressure of a film formation atmosphere was set at 20 Pa, and the film formation temperature was set at 625° C.

The above etch-back was performed using a microwave etching system. In the first etching, a mixed gas of oxygen ($O_2$) at a flow rate of 6 sccm and chlorine ($Cl_2$) at a flow rate of 74 sccm was used as an etching gas, the pressure of an etching atmosphere was set at 0.8 Pa, and the applied power was set at 60 W. In the second etching, a mixed gas of oxygen ($O_2$) at a flow rate of 4 sccm and hydrogen bromide (HBr) at a flow rate of 120 sccm was used as an etching gas, the pressure of an etching atmosphere was set at 1.33 Pa, and the applied power was set at 70 W.

Next, as shown in FIG. 3D, in a fourth step, portions (shown by the two-dot chain line) of the oxide films 61 and 62 formed on the bottom portions of the viaholes 38 and 39 were removed by RIE.

A native oxide film (not shown, which is similar to the native oxide film 30 shown in FIG. 1) formed on the bottom portions of the viaholes 38 and 39 was removed by normal light etching. The light etching was performed by dipping in a buffer hydrofluoric acid (solution having a composition of HF: 0.1 wt %, $NH_4F$: 39.9 wt %, and $H_2O$: 60.0 wt %) for 60 seconds.

After that, the viaholes 38 and 39 were buried with a conductive material (for example, a metal) in the same manner as that in the first method (see FIGS. 2E and 2F), to form plugs. An adhesive layer was then formed on the interlayer insulating film 23 and an interconnection layer was formed on the adhesive layer. The adhesive film and the interconnection layer were then subjected to patterning, to form upper interconnections.

In the second method of the present invention, the number of the steps of forming the side wall films 40 and 41 is larger than that in the first method of the present invention; however, since each of the side wall films 40 and 41 is made from a polycrystalline silicon having a high resistance against etching using buffer hydrofluoric acid, the film thickness of each of the side wall films 40 and 41 can be thinned more than that in the first method. Consequently, it is possible to minimize the reduction in diameter of each of the viaholes 38 and 39 due to formation of each of the side wall films 40 and 41.

Although each of the side wall films 40 and 41 is made from a polycrystalline silicon, it may be made of an amorphous silicon film or a metal silicide film having a high resistance against hydrofluoric acid such as tungsten silicide or molybdenum silicide film.

In the above description of the first and second methods of the present invention, an interlayer insulating film planarized using a two-layer stopper is formed with a viahole; however, the planarization of the interlayer insulating film may be performed by other methods. The present invention can be also applied to a viahole formed in an interlayer insulating film not planarized.

Furthermore, an SOI substrate used in the examples of the first and second methods may be of course replaced with a bulk substrate.

The film formation conditions in the examples are illustrative purpose only, and other film formation conditions may be used so long as they can form desirable films.

What is claimed is:

1. A method of forming a viahole, comprising:

forming a viahole in a single step through an interlayer insulating film having a multi-layer structure comprising a plurality of adjacent insulating layers which are formed of a plurality of different types of insulating material, said different types of insulating material having different polishing rates;

forming an oxide film by oxidizing a layer underlying said insulating film at least at a bottom portion of said viahole;

forming a side wall film on a side wall of said viahole;

removing said oxide film; and removing a native oxide film formed on a bottom portion of said viahole by etching.

2. A method of forming a viahole according to claim 1, wherein said side wall film is made from a material having an etching rate lower than that of the native oxide film in etching using a hydrofluoric acid based etchant.

3. A method of forming a viahole according to claim 1, wherein said multi-layer insulating film comprises a layer of PSG and a layer of NSG.

4. A method for forming a viahole according to claim 1, wherein said multi-layer insulating film comprises a layer of PSG, a layer of BPSG and at least one layer of NSG.

5. A method of forming a viahole according to claim 1, wherein said forming a side wall film comprises forming a side wall film of TEOS silicon oxide film.

6. A method of forming a viahole according to claim 1, wherein said forming a side wall film comprises forming a side wall film of silicon oxide film using a source gas comprising dinitrogen oxide and monosilane.

7. A method of forming a viahole according to claim 1, wherein said forming a side wall film comprises forming a side wall film of silicon oxide film using a source gas comprising dinitrogen oxide and dichlorosilane.

8. A method of forming a viahole according to claim 1, wherein said forming a side wall film comprises forming a side wall film of silicon nitride.

9. A method of forming a viahole according to claim 1, wherein said forming a side wall film comprises forming a side wall film of polycrystalline silicon.

10. A method of forming a viahole according to claim 1, wherein said forming a side wall film comprises forming a side wall film of metal silicide.

11. A method of forming a viahole according to claim 1, wherein said multi-layer insulating film comprises two insulating layers of approximately equal thickness.

* * * * *